SOLID-STATE CONTROL SYSTEM
Filed May 23, 1968
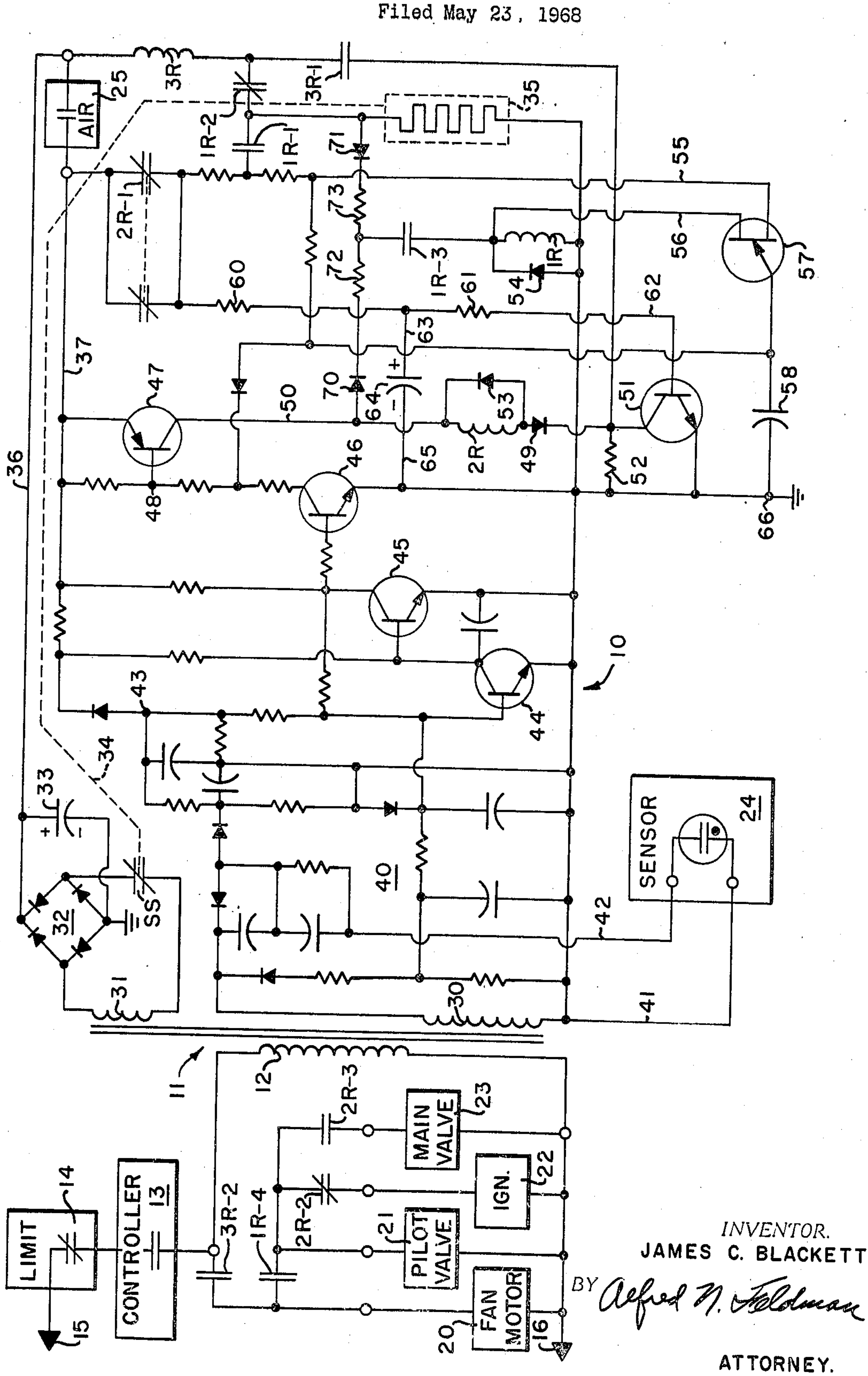
INVENTOR.
JAMES C. BLACKETT
BY Alfred N. Feldman
ATTORNEY.

United States Patent Office 3,482,922

Patented Dec. 9, 1969

3,482,922

SOLID-STATE CONTROL SYSTEM

James C. Blackett, Rosemount, Minn., assignor to Honeywell, Inc., Minneapolis, Minn., a corporation of Delaware Filed May 23, 1968, Ser. No. 731,554
Int. Cl. F23n *5/00*; G05d *29/00*
U.S. Cl. 431—26 9 Claims

ABSTRACT OF THE DISCLOSURE

A solid-state control system having a number of amplifier stages between its input and output. The output amplifier stage controls a relay that has a plurality of contacts. One set of contacts for the output relay is used to control a solid-state switch that is in parallel with a power limiting impedance. The solid-state switch operates in response to the relay and a time delay to remove the solid-state switch as a short circuit around the power limiting impedance so that the power to the final stages can be reduced. The relay can be held energized by a lower level of energy once it has been operated than is required to operate it initially.

CROSS-REFERENCE TO RELATED APPLICATION

The present application is an improvement applicable to the invention disclosed in application Ser. No. 685,193, filed Nov. 22, 1967, and now Patent No. 3,449,055, in the name of V. C. Blackett and titled "Burner Control Apparatus With Prepurge Timing."

BACKGROUND OF THE INVENTION

In the present day conversion of equipment from conventional electronics which utilized filament heated vacuum tubes to solid-state devices, a great effort has been put forth on reducing the volume and weight of electronic equipment. The reduction in volume and weight of electronic equipment is quite easily accomplished with solid-state and integrated circuit techniques, but this conversion has emphasized a problem that was not previously too important.

In equipment that used vacuum tubes, the tubes were heated by electrical filaments and heat dissipation was quite substantial. As a result of this, the devices were made quite large and the dissipation of power from other components was small enough as to be of no particular consequence. In present day solid-state equipment, the heat dissipation from the solid-state elements is quite small compared to the heat dissipation of other equipment. As a result of this, the problem has arisen that the heat dissipated by various of the components contained in control equipment become quite large as compared to the heat dissipated by the solid-state components and in order to provide the compact size for solid-state equipment, some way of removing heat or reducing dissipation must be found.

In many solid-state devices, the end or output device is a conventional electromechanical type of relay. It has long been known that a relay requires a substantially higher energy input to pull in the relay than is required to ultimately hold the relay in its energized state. Most types of equipment have ignored this difference in energy levels and have merely provided for the pull in of the control relays and the maintenance of those relays at their full energized level. This dissipates heat which is unwanted in present day solid-state compact type of equipment. The present invention is directed to a reduction in this heat dissipation.

SUMMARY OF THE INVENTION

The present invention is directed to a solid-state amplifier circuit that operates with a condition responsive sensor and which has an ultimate output in the form of an electromechanical device, such as a relay. The invention is directed specifically to the concept of inserting an impedance in the power source to the output relay and bypassing this impedance with a solid-state switch or transistor. The solid-state switch is open circuited to insert the impedance thereby dropping the power to the output relay after the relay has pulled in. This is accomplished by connecting one of the output contacts from the relay to the solid-state switch or transistor thereby controlling its operation. In some cases, this cannot be done unless a time delay is inserted between the operation of the relay and of the solid-state switch across the power dropping impedance. If the time delay circuit of the present invention is left out, there is the possibility that in certain cases the unit will not function properly.

In addition to the insertion of an impedance short circuited by a solid-state switch in the output stage, the present invention is directed to the full energization of the input or sensitive stages of the solid-state system. By applying the present concept of a dropping impedance only to the latter stages of the equipment, it is possible to maintain the constant sensitivity required of devices such as amplifiers in burner control systems and yet obtain the power reduction necessary in the last stages where most of the power is dissipated. The object is to reduce the total power consumption of the unit particularly in the relay stage after the relay operates.

BRIEF DESCRIPTION OF THE DRAWING

The present drawing is of a complete solid-state burner control system including the necessary sensor and output circuits.

DESCRIPTION OF THE PREFERRED EMBODIMENT

The present invention is disclosed as applied to a burner control system which is an improvement of the previously mentioned Blackett application, Ser. No. 685,193. Only the portions of the present circuit which are necessary for an understanding of the specific invention involved will be brought out in detail. For a complete understanding of the balance of the circuit and how it operates reference can be made to the previously mentioned pending application.

A solid-state control system 10 is disclosed which incorporates the present invention. The circuit 10 is supplied with power from a transformer 11 having a primary winding 12 connected through a controller 13 and safety limit 14 to a pair of terminals 15 and 16 that are in turn connected to a conventional source of alternating current. The limit 14 is normally closed unless an unsafe condition exists. The controller 13 operates the control system 10 in response to a need for heat and can be a conventional thermostat.

The control system 10 is applied to a conventional fuel burner which includes a fan and motor 20, a pilot valve 21, an ignition means 22, a main fuel valve 23, a flame or condition responsive sensor means 24, and an air-responsive switch 25 (shown in the upper right-hand portion of the circuit). It is noted that the sensor 24 responds to the presence or absence of flame when a proper and normal burner operation exists. The sensor is shown in the present application as a gas filled ultraviolet responsive tube of a type well known in the art but can be any other type of flame sensing device such as a flame rod, as is shown in the previously mentioned Blackett application, Ser. No. 685,193.

Transformer 11 has a pair of secondary windings 30 and 31. Secondary winding 31 provides a step-down voltage transforming function to a rectifier bridge 32 to supply direct current potential across a capacitor 33. Also associated with the transformer secondary winding 31 is a safety switch SS which is operated by a mechanical linkage 34 from an electrical heater element 35, which is contained in the control system 10. The heater element 35, linkage 34 and safety switch SS are a conventional burner protection device and the switch SS is normally closed with proper burner operation. The direct current voltage at capacitor 33 is supplied by conductor 36 to a relay 3R and to the normally open air switch 25. During normal operation of the system, air switch 25 closes to supply a direct current potential to conductor 37 which forms the main direct current potential source for the amplifier circuits contained in the control system 10.

The transformer secondary winding 30 supplies a relatively high voltage to a sensor responsive portion 40 of the system 10. The circuit portion 40 is made up of resistors, diodes and capacitors to apply an appropriate voltage between conductors 41 and 42 to the sensor 24 so that sensor 24 can function properly in the presence and absence of the flame at burner (not shown). The circuit portion 40 has an output terminal 43 which has a relatively low voltage when the sensor 24 is exposed to a dark surrounding or an absence of flame to which it is to respond. When a flame is present at the sensor 24, the voltage at terminal 43 increases in value and is used as a means of controlling the balance of the system 10. There are a number of possible configurations of sensor energizing circuits and the presently disclosed circuit portion 40 is of the type completely disclosed in the pending application to James C. Blackett filed on Aug. 22, 1966 and given Ser. No. 573,892 now Patent No. 3,428,901 entitled "Condition Detecting Apparatus." All that is necessary for the explanation of the present application is to understand that when the sensor 24 is exposed to an unilluminated surroundings, the voltage terminal 43 is substantially lower than when the sensor 24 is exposed to a flame.

Terminal 43 acts as an input to a first transistor 44 which in turn amplifies the condition responsive sensor signal and supplies it to transistor 45. The transistor 45 in turn transmits its mode of operation to transistor 46. Transistor 46 controls the operation of the output transistor 47. It is sufficient to understand at this point that, when the voltage at terminal 43 is at its lower level (when sensor 24 is unilluminated), the transistor 44 is in a nonconductive state thereby allowing transistor 45 to conduct freely. This in turn shorts out the base to emitter of transistor 46 causing it to be nonconductive. The failure of transistor 46 to conduct allows the base 48 of transistor 47 to be substantially at the potential of conductor 37 thereby keeping the transistor 47 in a nonconductive state. When the voltage at terminal 43 rises with the sensor 24 exposed to a flame, the transistor 44 conducts freely thereby turning off transistor 45. The off condition of transistor 45 allows the transistor 46 to conduct freely thereby lowering the potential at the base 48 of transistor 47 and allowing the transistor 47 to conduct.

The transistor 47, when it is conducting, supplies current from conductor 37 to a conductor 50, a relay 2R, a blocking diode 49, a solid-state switch means or transistor 51, and the paralleling resistor or impedance means 52. It will be noted that solid-state switch means or transistor 51 has its emitter-collector paralleled by resistor 52 and that they are jointly connected to a common ground 66. It is also noted that relay 2R is paralleled by a diode 53 as is conventional for the freewheeling effect in operating inductive devices in transistor circuitry. The specific operation of this portion of the circuit will be brought out in detail after the balance of the circuit has been described.

In addition to the previously mentioned relays 2R and 3R, a remaining relay 1R is provided for the proper operation of the system 10. A freewheeling diode 54 is connected around the relay 1R. Each of the 3-relays 1R, 2R and 3R have associated with them normally open and normally closed relay contacts. These relay contacts have been designated as 1R–1, 1R–2, 1R–3 and 1R–4, which contacts are associated with the 1R relay. The relay 2R has associated with it contacts 2R–1 (a redundant pair of normally closed contacts), 2R–2 and 2R–3. The relay 3R has a pair of contacts 3R–1 and 3R–2. The over-all control system 10 operates from these 3 relays and their associated contacts, and the relay sequence will be described in some detail after the balance of the circuit has been noted.

The direct current voltage supplied through the air switch 25 is supplied through relay contacts 2R–1 to various circuits. One of the circuits includes conductors 55 and 56 which supply voltage to unijunction transistor 57 that forms part of a prepurged timing network as specifically disclosed in the previously mentioned Blackett application, Ser. No. 685,193. The unijunction transistor 57 is connected to a timing capacitor 58 which is used to control the relay 1R in the present system. The direct current voltage applied to contacts 2R–1 is also directly applied to a series pair of resistors 60 and 61 which make up part of the circuit incorporating the present invention. The resistance network made up of resistors 60 and 61 is connected by conductor 62 to the base of transistor 51. The junction of resistors 60 and 61 is connected by conductor 63 to a timing capacitor 64 which in turn is connected by conductor 65 to the ground junction 66. The timing capacitor 64 is used to provide a time delay function in the operation of the transistor 51, as will be detailed when the description of the inventive portion of the present system is described. A final circuit made up of a pair of diodes 70 and 71 along with resistors 72 and 73 are used for operation of the relay 1R.

OPERATION

Since the invention incorporated in the present control system operates when the burner control system disclosed is functioning in a normal fashion, only this mode of operation will be described. Under normal conditions, the limit switch 14 is closed and the controller 13 is open. On a call for heat, the controller 13 closes thereby applying voltage to transformer primary 12 from the terminals 15 and 16. The transformer secondary 31 and bridge 32 generate a direct current voltage at capacitor 33 since the safety switch SS is normally closed. At this same time the transformer secondary winding 30 provides a high voltage to the sensor control portion 40 of the control system 10. This voltage is applied by conductors 41 and 42 to the sensor 24 which is exposed to a relatively dark atmosphere as there is no flame at the burner (not shown) at this time. Under these conditions, the voltage appearing at terminal 43 is relatively low and the amplifier circuits of transistors 44, 45, 46 and 47 keep the transistor 47 in a nonconductive state.

The application of direct current voltage to conductor 36 in turn is applied to relay 3R through the normally closed contact 1R–2 and the safety switch heater resistor 35 to the ground terminal 66, thereby completing the circuit through the relay 3R and causing it to operate. The operation of relay 3R immediately closes contacts 3R–1 and 3R–2. At this time the air switch 25 is still open and there is no potential supplied to the main control system.

The closing of contact 3R–2 supplies voltage to the fan motor 20 allowing it to come into operation. As the fan motor 20 comes up to speed, the air switch 25 is activated thereby applying the direct current voltage from conductor 36 to conductor 37. Also at this time, the direct current voltage on conductor 37 is applied through the redundant contacts 2R–1 through the resistor 60 to the capacitor 64. The capacitor 64 therefore begins charging immediately. The resistor 60 is of a relatively small value and merely limits surge current to the system. The capacitor 64 charges almost immediately to the applied voltage. The voltage appearing across capacitor 64 is applied through resistor 61 to the base of transistor 51. This causes transistor 51 to conduct in a saturated manner and this shorts out the impedance or resistance 52. It thus appears that initially the impedance means 52 and parallel connected solid-state switch means 51 causes the system to operate as if the impedance means or resistance 52 was not in the circuit.

The application of the potential through the redundant contact 2R–1 also applies voltage to the unijunction transistor 57 which starts a timing function or prepurge function with the capacitor 58. When the prepurge period has ended, the capacitor 58 discharges through the unijunction 57 and through the means of conductor 56 to relay 1R. This pulls relay 1R in along with its contacts. Relay contacts 1R–1 and 1R–2 transfer the energizing voltage for the safety switch heater 35. Contact 1R–3 completes a holding circuit for its own relay 1R through the diode 71 and resistor 73. The relay contact 1R–4 completes the circuit to the pilot valve 21 and through the normally closed contact 2R–2 to the ignition means 22. This turns on the pilot burner system for the main burner and attempts to start the system. At this point, if the condition responsive sensor means 24 senses the presence of an ignition flame from the pilot valve, the voltage at terminal 43 increases significantly starting the final sequence of operation of the over-all system 10. A rise in voltage at terminal 43 causes the transistor 44 to begin conducting thereby turning off transistor 45. The transistor 45 being turned off opens the substantial short circuit between the base and emitter electrodes of transistor 46 thereby allowing transistor 46 to conduct. As transistor 46 conducts, a voltage decrease occurs at the base 48 of transistor 47 and the transistor 47 begins to conduct. The conduction of transistor 47 is through the relay 2R and through the fully conducting transistor 51 to ground. This pulls in the final relay 2R. The operation of relay 2R operates the normally closed contact 2R–2 to an open condition removing the ignition means 22 and closing the contact 2R–3 to open the main valve for the burner. The main valve fuel is ignited since the pilot valve has been left in an open condition and flame has been sensed.

The operation of relay 2R then opens the pair of redundant contacts 2R–1 removing the direct current potential applied to resistors 60 and 61 which had been used as a path for maintaining the transistor 51 in conduction. The capacitor 64 immediately starts to discharge through conductor 63, resistor 61, and the base to emitter circuit of transistor 51. As soon as the capacitor 64 completes its discharge, the transistor 51 no longer has sufficient base voltage to maintain it in conduction and this transistor then becomes nonconductive. The nonconductive status of the solid-state switch means or transistor 51 thereby effectively opens the short circuit that has been applied around the impedance means or resistance 52. This inserts the resistance 52 in the circuit which supplies current to the relays 2R and 3R. Since both of the relays 2R and 3R had been previously pulled in, the reduced voltage to these two relays will keep them in the energized state. The insertion of resistor 52 in their conduction circuits reduces the dissipation in the system 10. This basically is the heart of the present invention.

It is noted that the relay 1R has been connected to the ground 66 without passing through a circuit including the impedance means or resistance 52. This has been a matter of choice due to the particular relay used in the production version of the present circuit. The relay 1R and its free-wheeling diode 54 could be connected so as to have its current flow reduced by the impedance means or resistance 52 if desired.

It is noted in the present burner control system that the over-all solid-state amplifier means has an input circuit which is responsive to a condition responsive sensor and which has an output that energizes a plurality of relays. The relays are pulled in on a full voltage basis so that all of the energy necessary to operate the relays is available. One of the relays has a contact that is operated when the relay pulls in to operate a solid-state switch in the form of transistor 51 to remove the transistor 51 as a short around an impedance means 52 thereby dropping the potential to the relays and reducing their power dissipation. While the present invention has been specifically disclosed in connection with a particular flame safeguard or burner system, the application is not limited to this particular circuit. It is obvious that one skilled in the art could vary the application of this invention to many types of circuits and could provide various types of time delay arrangements for the solid-state switch used around the dropping impedance means. For this reason, the applicant wishes to be limited in the scope of the invention solely by the scope of the appended claims.

The embodiments of the invention in which an exclusive property or right is claimed are defined as follows:

1. A control system including: solid-state amplifier means having power supply and connection means connected to energize said amplifier means; input means for said amplifier means adapted to be connected to condition responsive sensor means; output means for said amplifier means including relay means with said relay means being capable of being energized to an operated state by applying a first power level and maintained in said state by applying a lower power level; contact means operated by said relay means for utilization of said amplifier means in response to said condition responsive means; impedance means and parallel connected solid-state switch means connected in a series circuit with said power supply connection means; and circuit means connecting said relay contact means to said solid-state switch means wherein said contact means operation in turn operates said solid-state switch means to effectively insert said impedance means in said power supply connection means to reduce the power to said relay means to said lower power level.

2. A control system as described in claim 1 wherein said circuit means connecting said relay contact means to said solid-state switch means includes time delay network means.

3. A control system as described in claim 2 wherein said time delay network includes a capacitor; said capacitor charging from said power supply means before said relay contact means operates; said capacitor discharging through said solid-state switch means after said relay contact means operate to delay the operation of said solid-state switch means.

4. A control system as described in claim 1 wherein said system is a fuel burner control system and said condition responsive sensor means responds to the presence of a flame to operate said relay means.

5. A control system as described in claim 4 wherein said circuit means connecting said relay contact means to said solid-state switch means includes time delay network means.

6. A control system as described in claim 5 wherein said time delay network includes a capacitor; said capacitor charging from said power supply means before said relay contact means operates; said capacitor discharging through said solid-state switch means after said relay contact means operates to delay the operation of said solid-state switch means.

7. A control system as described in claim 1 wherein said impedance means and parallel connected solid-state switch means is connected in a series circuit with said power supply connection means between an input stage of said solid-state amplifier means and an output stage of said solid-state amplifier means so that when said solid-state switch means operates to reduce the power to said relay means said input stage of said solid-state amplifier means remains fully energized.

8. A control system as described in claim 7 wherein said circuit means connecting said relay contact means to said solid-state switch means includes time delay network means.

9. A control system as described in claim 8 wherein said time delay network includes a capacitor; said capacitor charging from said power supply means before said relay contact means operates; said capacitor discharging through said solid-state switch means after said relay contact means operate to delay the operation of said solid-state switch means.

References Cited

UNITED STATES PATENTS

| | | | |
|---|---|---|---|
| 2,989,117 | 6/1961 | Graves | 431—26 |
| 3,306,339 | 2/1967 | Barton et al. | 431—26 |

EDWARD G. FAVORS, Primary Examiner

U.S. Cl. X.R.

328—2; 431—79